(12) United States Patent  (10) Patent No.: US 8,592,689 B2
Shimada  (45) Date of Patent: Nov. 26, 2013

(54) VOLTAGE CONVERSION MODULE

(75) Inventor: Osamu Shimada, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 251 days.

(21) Appl. No.: 13/242,819

(22) Filed: Sep. 23, 2011

(65) Prior Publication Data

US 2012/0081861 A1   Apr. 5, 2012

(30) Foreign Application Priority Data

Sep. 30, 2010 (JP) ............................... P2010-222830
Aug. 1, 2011 (JP) ............................... P2011-168463

(51) Int. Cl.
*H05K 1/16* (2006.01)
*H05K 1/18* (2006.01)

(52) U.S. Cl.
USPC ........................... 174/260; 361/763; 361/764

(58) Field of Classification Search
USPC .......... 174/256, 258–260; 361/760–764, 782
See application file for complete search history.

(56) References Cited

U.S. PATENT DOCUMENTS

| 6,975,516 B2 | 12/2005 | Asahi et al. |
| 6,985,364 B2 | 1/2006 | Higashitani et al. |
| 7,294,587 B2 | 11/2007 | Asahi et al. |

FOREIGN PATENT DOCUMENTS

| CN | 1418048 | 5/2003 |
| EP | 1 304 742 A2 | 4/2003 |
| EP | 1 357 597 B1 | 11/2008 |
| EP | 2 056 349 A1 | 5/2009 |
| JP | 2003-115664 | 4/2003 |
| JP | 2003-197849 | 7/2003 |
| KR | 2003-0032892 | 4/2003 |
| TW | 550997 | 9/2003 |
| WO | WO 03/032389 A1 | 4/2003 |

*Primary Examiner* — Jeremy Norris
*Assistant Examiner* — Tremesha S Willis
(74) *Attorney, Agent, or Firm* — Finnegan, Henderson, Farabow, Garrett & Dunner, L.L.P.

(57) ABSTRACT

On a multilayer wiring board which has a plurality of wiring pattern stacked in sequence separately from one another, insulating members each positioned between the plurality of wiring patterns, and interlayer connection bodies electrically connecting the plurality of wiring patterns and in which a voltage conversion IC is built in, a first capacitor, a second capacitor, and an inductor are mounted, the other of electrode portions in the first capacitor or one of electrode portions in the second capacitor is positioned between an input section of the first capacitor and the inductor, and the other of the electrode portions or the one of the electrode portions is electrically set to ground.

7 Claims, 4 Drawing Sheets

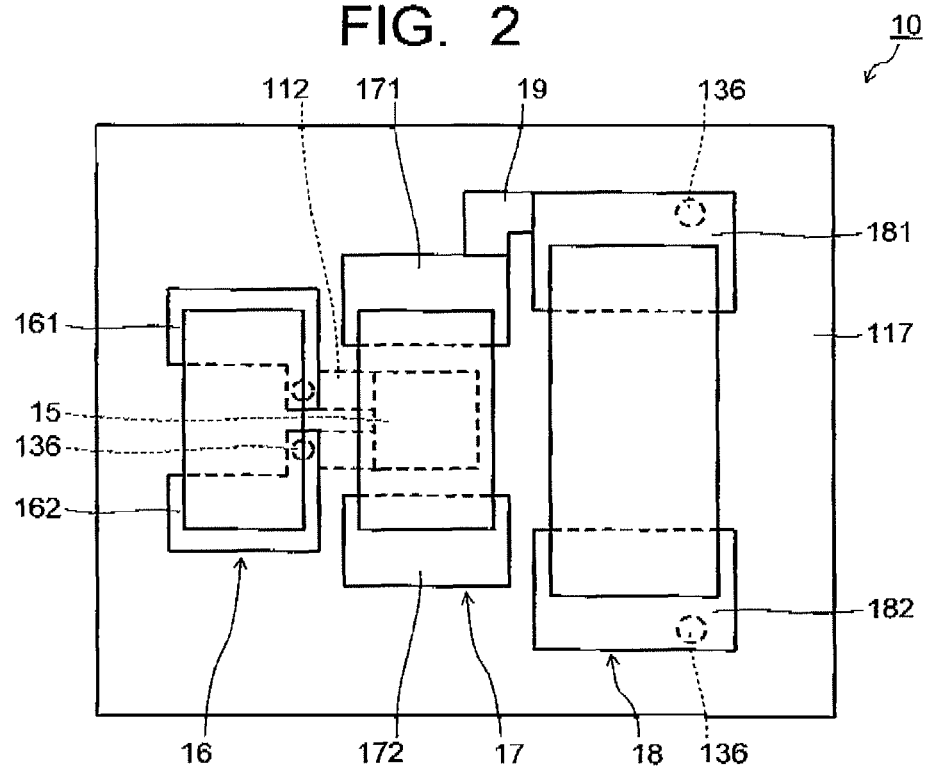
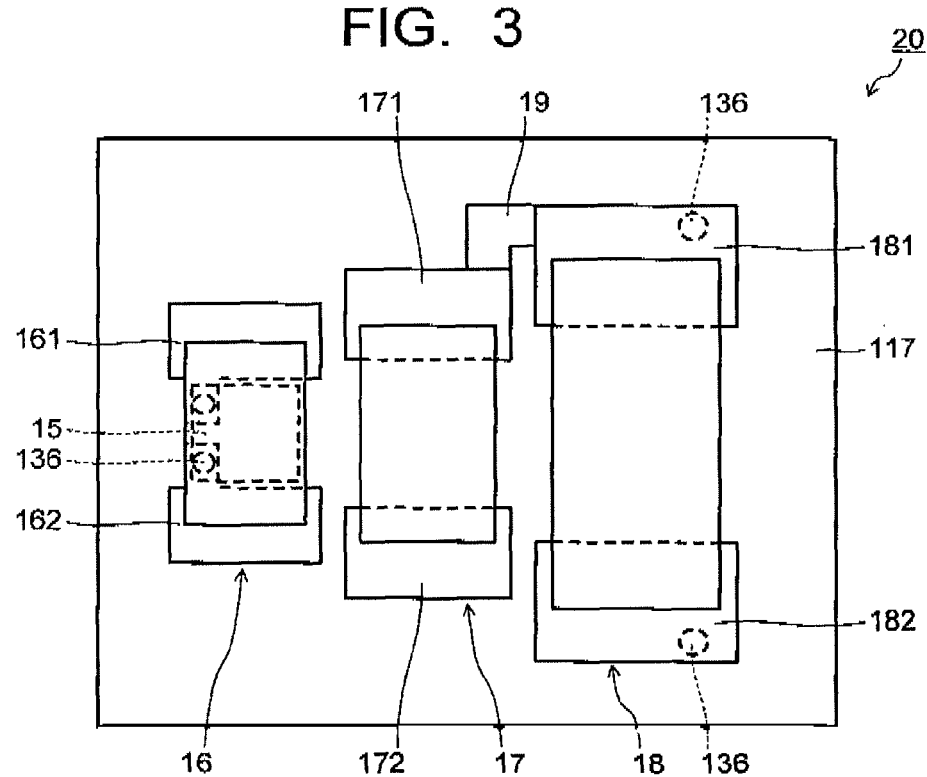

VOLTAGE CONVERSION MODULE

FIELD

Embodiments described herein relate generally to a voltage conversion module which can be suitably used in an information communication device and a mobile communication device.

BACKGROUND

In a recent trend of high performance and downsizing of an electronic device, a high density and a high function of a circuit component are further required. In view of the above, also in a module to which a circuit component is mounted, it is required to seek for a high density and a high function. In order to cope with such a requirement, the multilayering of a wiring board is often performed at present.

In such a multilayer wiring board as described above, a plurality of wiring patterns are disposed to be separated from one another and to be almost parallel, a plurality of insulating members are each provided between the corresponding ones of the wiring patterns, an electronic component such as a semiconductor component is embedded in one or some of the insulating members in a manner to be electrically connected to at least one of the wiring patterns, and a plurality of interlayer connection bodies (vias) penetrating through the insulating members in a thickness direction are formed, so that the wiring patterns are electrically connected to one another (for example, see Reference 1).

On the other hand, with regard to a voltage conversion IC, in order to make the voltage conversion IC drive sufficiently, the voltage conversion IC is configured such that a first capacitor is disposed in parallel to the voltage conversion IC in an input side, a smoothing inductor is disposed in an output side to be connected in series to the voltage conversion IC, the other terminal of the smoothing inductor is connected to an output terminal of a module, and a second capacitor is disposed to be connected in parallel. The first capacitor has a capacitance of about 2 μF and is used mainly for the stabilization of an input voltage to the voltage conversion IC. The second capacitor has a capacitance of about 4 μF and is used together with the smoothing inductor mainly for the stabilization of an output voltage from the voltage conversion IC.

The first capacitor has a size of 1 mm×0.5 mm for example, while the second capacitor has a size of 1.6 mm×0.8 mm for example. Further, the smoothing inductor has a size of 2 mm×1.25 mm for example.

Accordingly, for building in the voltage conversion IC as described above in the multilayer wiring board as an electric component, it is necessary to build in the capacitors and the inductor described above together with the voltage conversion IC. However, as described above, the first capacitor, the second capacitor, and the inductor are comparatively large in size and are thick, and thus it is difficult to build in all of the voltage conversion IC, the capacitors, and so on in the multilayer wiring board.

Thus, Reference 2 discloses to fabricate a module similar to a module in a case where electronic components such as a semiconductor component and so on are built in, by adopting a configuration where only a voltage conversion IC is built in a multilayer wiring board and where a first capacitor, a second capacitor, and an inductor are disposed in a capacitor built-in layer formed on the multilayer wiring board.

However, in Reference 2, the arrangement of the first capacitor, the second capacitor, and the inductor formed on the multilayer board is not taught at all. Accordingly, a large noise is overlapped on an input voltage depending on the arrangement state of the first capacitor, the second capacitor, and the inductor, thereby causing a problem that a stable output voltage cannot be obtained.

PATENT REFERENCE

Reference 1: JP-A 2003-197849 (KOKAI)
Reference 2: JP-A 2003-115664 (KOKAI)

SUMMARY OF THE INVENTION

It is an object of the present invention is, in a voltage conversion module constituted by arranging an input side capacitor and output side capacitor and inductor on a multilayer wiring board building in a voltage conversion IC, to obtain a stable output voltage by optimizing the arrangement state of the input side capacitor and the output side capacitor and the inductor thereby to reduce a noise overlapped on an input voltage.

In order to achieve the above-described object, the present invention relates to a voltage conversion module includes: a multilayer wiring board which has a plurality of wiring patterns stacked in sequence separately from one another, insulating members each positioned between the plurality of wiring patterns, and interlayer connection bodies electrically connecting the plurality of wiring patterns; a voltage conversion IC to perform voltage conversion, the voltage conversion IC mounted to one of the wiring patterns positioned in an inner side among the plurality of wiring patterns; a first capacitor in an input side and a second capacitor in an output side, the first capacitor and the second capacitor being mounted on a main surface of the multilayer wiring board and having electrode portions on both ends electrically connected to the voltage conversion IC via the plurality of the wiring patterns and the interlayer connection bodies; and an output side inductor which has electrode portions on both ends electrically connected to the second capacitor in series on the main surface of the multilayer wiring board, wherein one of the electrode portions in the first capacitor constitutes an input section and one of the electrode portions of the inductor constitutes an output section, wherein the other of the electrode portions in the first capacitor or one of the electrode portions in the second capacitor is positioned between the input section and the inductor, and the other of the electrode portions in the first capacitor or the one of the electrode portions in the second capacitor is electrically set to ground.

In general, in a voltage conversion module, since a large electric current flows in an inductor, a large electric field is generated from that inductor. Accordingly, in the voltage conversion module, if its input section is disposed close to the inductor, a high frequency electric current based on the above-described magnetic field is overlapped as a noise on an input voltage inputted to the voltage conversion module, and consequently, an output voltage is not stabilized.

On the other hand, according to the voltage conversion module of the present invention, on the multilayer wiring board building in a voltage conversion IC, the first capacitor which is positioned in the input side in relation to the voltage conversion IC and the second capacitor and the inductor which are positioned in the output side are configured such that one electrode portion which does not constitute the input section of the first capacitor is disposed between the input section provided in the first capacitor and the inductor having an output section in relation to the input section, and that an electric potential thereof is set to be a ground potential. Further, one of electrode portions in the second capacitor is disposed, and its electric potential is set to be a ground potential.

In other words, it is configured such that the electrode portion of the ground potential constantly is disposed between the input section and the inductor of the voltage conversion module. Accordingly, since a high frequency electric current based on a magnetic field generated in the inductor flows to the electrode portion, it becomes possible to sufficiently suppress overlapping of the high frequency electric current based on the magnetic field on an input voltage in the input section as a noise. As a result, it becomes possible to obtain a stable output voltage from the output section provided in the inductor.

It should be noted that as is obvious from aforementioned explanation, the voltage conversion module of the present invention is made based on the finding of a fact that, in an inductor, a large electric current flows thereby generating a large magnetic field from the inductor, and that, in a voltage conversion module, if its input section is disposed close to the inductor, a high frequency electric current based on the above-described magnetic field is overlapped on an input voltage inputted to the voltage conversion module as a noise, resulting in an unstable output voltage.

Accordingly, the present invention includes not only a concrete configuration of the aforementioned voltage conversion module but also the finding of the aforementioned fact.

Further, in the present invention, since the voltage conversion IC is built in the multilayer wiring board constituting the voltage conversion module, the multilayer wiring board, that is, the voltage conversion module can be downsized. It should be noted that the aforementioned capacitors and inductor are comparatively large in size, and the building in of the capacitors and the inductor in the multilayer wiring board makes the multilayer wiring board larger, thereby making the voltage conversion module larger.

In an embodiment of the present invention, it is possible that the first capacitor, the second capacitor, and the inductor are disposed in parallel in a manner to be parallel to one another in length directions defined between the electrode portions positioned on respective both ends on the multilayer wiring board and that one of the electrode portions in the second capacitor is positioned between the input section and the inductor, the one of the electrode portions being electrically set to ground.

Further, in another embodiment of the present invention, it is possible that one of the electrode portions constituting the input section of the first capacitor faces one of the electrode portions electrically set to ground of the second capacitor. In this case, since the input section and the output section of the voltage conversion module can be disposed most separated from each other, the interference between an input voltage (an electric filed and a magnetic field thereby) in the input section and an output voltage (an electric field and a magnetic field thereby) in the output section can be suppressed, and thereby the output voltage from the output section can be further stabilized.

Further, in still another embodiment of the present invention, it is possible that the first capacitor and the second capacitor are disposed, on the multilayer wiring board, in parallel in a manner to be parallel to each other in length directions defined between the electrode portions positioned on respective both ends and in a manner to be vertical in relation to a length direction defined between the electrode portions positioned on both ends of the inductor, and the other of the electrode portions in the first capacitor is positioned between the input section and the inductor, the other of the electrode portions being electrically set to ground.

According to the present invention, in a voltage conversion module constituted by arranging an input side capacitor as well as an output side capacitor and an inductor on a multilayer wiring board building in a voltage conversion IC, the arrangement state of the input side capacitor as well as the output side capacitor and inductor is optimized, whereby a noise overlapped on an input voltage is reduced and a stable output voltage can be obtained.

BRIEF DESCRIPTION OF THE DRAWINGS

FIG. 2 is a top plan view of the voltage conversion module illustrated in FIG. 1.

FIG. 3 is a top plan view illustrating a voltage conversion module of a second embodiment.

DETAILED DESCRIPTION

Hereinafter, concrete features of the present invention will be described based on embodiments for realizing the invention.

First Embodiment

Figure 1:
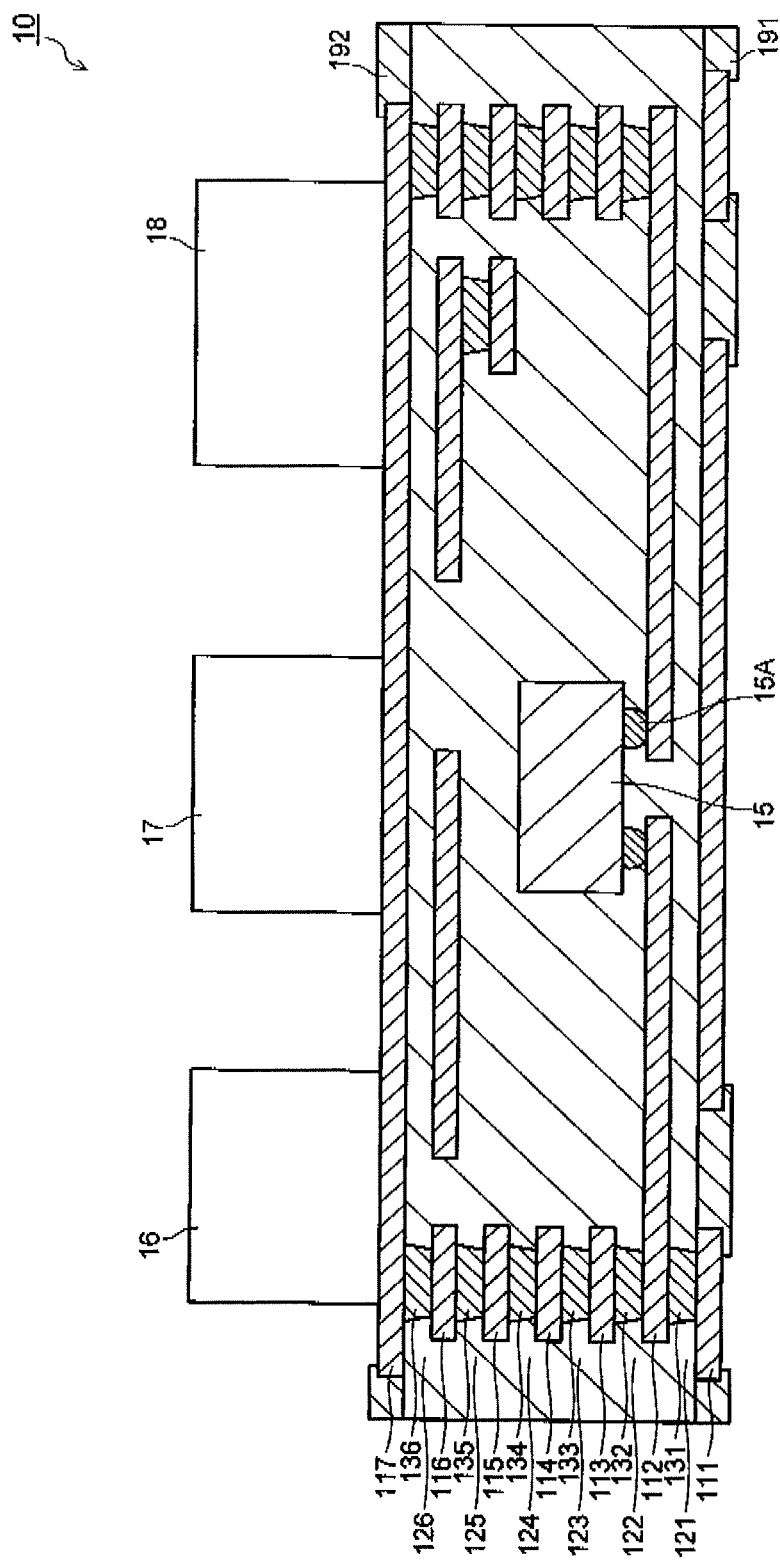
FIG. 1 is a partial cross-sectional configuration diagram illustrating a voltage conversion module of a first embodiment.

FIG. 1 is a partial cross-sectional configuration diagram illustrating a voltage conversion module of the present embodiment, while FIG. 2 is a top plan view of the voltage conversion module illustrated in FIG. 1. As is obvious from FIG. 1 and FIG. 2, only a portion of a multilayer wiring board of the voltage conversion module is illustrated in a cross section in FIG. 1.

A voltage conversion module 10 illustrated in FIG. 1 has, in sequence from a lower side, a first wiring pattern 111, a second wiring pattern 112, a third wiring pattern 113, a fourth wiring pattern 114, a fifth wiring pattern 115, a sixth wiring pattern 116, and a seventh wiring pattern 117.

Further, between the adjacent wiring patterns among the first wiring pattern 111 to the seventh wiring pattern 117, there are interposed a first insulating member 121 to a sixth insulating member 126, respectively.

More specifically, the first insulating member 121 exists between the first wiring pattern 111 and the second wiring pattern 112, the second insulating member 122 exists between the second wiring patter 112 and the third wiring pattern 113, the third insulating member 123 exists between the third wiring pattern 113 and the fourth wiring pattern 114. Further, the fourth insulating member 124 exists between the fourth wiring pattern 114 and the fifth wiring pattern 115, the fifth insulating member 125 exists between the fifth wiring pattern 115 and the sixth wiring pattern 116, and the sixth insulating member 126 exists between the sixth wiring pattern 116 and the seventh wiring pattern 117.

Further, the adjacent wiring patters among the first wiring pattern 111 to the seventh wiring pattern 117 are electrically connected to one another by a first interlayer connection body 131 to a sixth interlayer connection body 136.

The first wiring pattern 111 to the seventh wiring pattern 117, the first insulating member 121 to the sixth insulating member 126, and the first interlayer connection body 131 to the sixth interlayer connection body 136 constitute a multilayer wiring board.

It should be noted that a resist layer 191 is formed on the first wiring pattern 111 in a manner to expose a part of the wiring pattern 111, while a resist layer 192 is formed on the seventh wiring pattern 117 in a manner to expose a part of the wiring pattern 117.

In FIG. 1, though the first insulating member 121 to the sixth insulating member 126 are illustrated as distinguishable, the insulating members are fuse-bonded to one another in reality, the insulating members are hard to be distinguished. In the present embodiment, in order to clarify the feature of the present invention, those insulating members are illustrated as distinguishable for convenience's sake.

Further, the voltage conversion module 10 illustrated in FIG. 1, that is, the multilayer wiring board constituting the voltage conversion module 10 is of seven layers in the present embodiment, but the number of the layers can be arbitrary as necessary.

In the voltage conversion module 10 illustrated in FIG. 1, the second wiring pattern 112 functions as a component mounting wiring layer, and a voltage conversion IC 15 is electrically and mechanically connected to and mounted on the wring pattern 112 via a solder ball 15A.

It should be noted that though in the present embodiment the voltage conversion IC 15 is mounted on the second wiring pattern 112, the voltage conversion IC 15 can be mounted on any one of the first wiring pattern 111 to the seventh wiring pattern 117. Further, the voltage conversion IC can be vertically reversed and mounted on a predetermined wiring pattern.

Further, the seventh wiring pattern 117 also functions as a component mounting wiring layer, and a first capacitor 16, a second capacitor 17, and an inductor 18 are mounted in a manner to be adjacent to one another on the seventh wiring pattern 117, that is, on a main surface of the above-described multilayer wiring board. On this occasion, the first capacitor 16, the second capacitor 17, and the inductor 18 are disposed in parallel in a manner that a length direction defined between electrode portions 161, 162 positioned on both ends of the first capacitor 16, a length direction defined between electrode portions 171, 172 positioned on both ends of the second capacitor 17, and a length direction defined between electrode portions 181, 182 positioned on both ends of the inductor 18 are parallel to one another.

The first capacitor 16 is positioned, in the voltage conversion module 10 of the present embodiment, in an input side in relation to the voltage conversion IC 15. The second capacitor 17 and the inductor 18 are positioned in an output side in relation to the voltage conversion IC 15.

The electrode portion 162 of the first capacitor 16 constitutes an input section in the voltage conversion module 10 illustrated in FIG. 1, and an electric potential of the electrode portion 161 is set to ground. Further, the electrode portion 172 of the second capacitor 17 which faces the electrode portion 162 constituting the input section of the first capacitor 16 is set to ground. Further, the electrode portion 181 of the inductor 18 constitutes an output section in the voltage conversion module 10.

It should be noted that the electrode portion 171 of the second capacitor 17 and the electrode portion 181 constituting the output section of the inductor 18 are electrically connected by a wiring pattern 19 made of an electric good conductor such as Au, Ag, and Cu, for example.

Further, the first capacitor 16 and the inductor 18 are electrically connected to the seventh wiring pattern 117 via a not-shown solder material or the like.

Further, the voltage conversion IC 15 is electrically connected, via the second wiring pattern 112 and the first interlayer connection body 131 to the sixth interlayer connection body 136, to the remaining wiring patterns, that is, the first wiring pattern 111 and the third wiring pattern 113 to the seventh wiring pattern 117. Further, the first capacitor 16 and the inductor 18 are electrically connected, via the seventh wiring pattern 117 and the first interlayer connection body 131 to the sixth interlayer connection body 136, to the remaining wiring patterns, that is, the first wiring pattern 111 to the sixth wiring pattern 116.

Accordingly, the voltage conversion IC 15 is electrically connected also to the first capacitor 16 and the inductor 18, and the voltage conversion module 10 illustrated in FIG. 1 functions as a voltage conversion element.

In the voltage conversion module 10, since a large electric current flows in the inductor 18, a large magnetic field is generated from the inductor 18. Accordingly, in the voltage conversion module 10, if the input section constituted by the electrode portion 162 of the first capacitor 16 is disposed close to the inductor 18, a high frequency electric current based on the above-described magnetic field is overlapped as a noise on an input voltage inputted to the voltage conversion module 10, and consequently, an output voltage from the output section constituted by the electrode portion 181 of the inductor 18 is not stabilized.

However, according to the voltage conversion module 10 of the present embodiment, on the multilayer wiring board in which the voltage conversion IC 15 is built in, the first capacitor 16 which is positioned in the input side in relation to the voltage conversion IC 15 and the second capacitor 17 and the inductor 18 which are positioned in the output side are configured such that the electrode portion 172 of a ground potential in the second capacitor 17 is disposed between the input section (electrode portion 162) provided in the first capacitor 16 and the inductor 18 having the output section (electrode portion 181) in relation to the input section.

In other words, it is configured such that the electrode portion 172 of the ground potential is constantly disposed between the input section and the inductor 18 of the voltage conversion module 10. Accordingly, since the high frequency electric current based on the magnetic field generated in the inductor 18 flows to the electrode portion 172 of the ground potential, it becomes possible to sufficiently suppress the overlapping of the high frequency electric current based on the magnetic field on the input voltage in the input section as a noise. As a result, it becomes possible to obtain a stable output voltage from the output section (electrode portion 181) provided in the inductor 18.

Further, in the voltage conversion module 10 of the present embodiment, the electrode portion 162 constituting the input section of the first capacitor 16 is disposed in a manner to face the electrode portion 172 of the ground potential of the second capacitor 17. In this case, in the voltage conversion module 10, since the input section and the output section are disposed most separated from each other, the interference between an input voltage (an electric filed and a magnetic field thereby) in the input section and an output voltage (an electric field and a magnetic field thereby) in the output section can be suppressed, and thereby the output voltage from the output section can be further stabilized.

It should be noted that though in, the present embodiment the second capacitor 17 and the inductor 18 are electrically connected by the wiring layer 19, the second capacitor 17 and the inductor 18 can be connected via the wiring pattern and the interlayer connection body formed in the multilayer wiring board.

A capacitance of the first capacitor 16 can be equal to or more than 2 μF for example in view of input voltage stabilization, and it is preferable that the capacitance of the first capacitor 16 is equal to or less than 10 μF in view of a cost and a size.

On the other hand, it is preferable that the second capacitor 17 has a capacitance equal to or more than 4 μF in view of the stabilizing the output voltage from the voltage conversion IC 15, that is, from the voltage conversion module 10 together with the inductor 18, and it is preferable that the second capacitor 17 has a capacitance equal to or less than 10 μF in view of a cost and a size.

It should be noted that the lowest layer of the multilayer wiring board, that is, the wiring pattern positioned on a rear surface facing the above-described main surface, that is, the first wiring pattern 111 can be made function as a terminal layer. Thereby, the voltage conversion module 10 illustrated in FIG. 1 can be easily connected to an external circuit and an external device, and it is possible to add a voltage conversion function to those external circuit and external device.

The voltage conversion module 10 of the present embodiment can be obtained as a result that a multilayer wiring board is manufactured based on a well known technique such as $B^2it$ (B-square it) and thereafter a first capacitor 16, a second capacitor 17, and an inductor 18 are mounted in a manner to be electrically connected to a wiring pattern positioned in a top layer of the obtained multilayer wiring board.

Further, in the present embodiment, since the voltage conversion IC 15 is built in the multilayer wiring board constituting the voltage conversion module 10, the multilayer wiring board, that is, the voltage conversion module 10 can be downsized.

Second Embodiment

FIG. 3 is a top plan view illustrating an example of a voltage conversion module of the present embodiment. It should be noted that a component the same as or similar to the component illustrated in FIG. 1 and FIG. 2 related to the first embodiment is represented by using the same reference numeral.

As illustrated in FIG. 3, a voltage conversion module 20 of the present embodiment is configured such that a voltage conversion IC 15 is positioned, in a multilayer wiring board, directly below a first capacitor 16 mounted on the multilayer wiring board. In this case, since a length of a wiring connecting the voltage conversion IC 15 and the first capacitor 16 can be made shorter, an inductance value and a resistance value of the wiring can be reduced, so that the noise elimination of the voltage conversion IC 15 can be performed more effectively.

It should be noted that other features and configurations are the same as those of the first embodiment, and explanation thereof will be omitted.

However, similarly to in the first embodiment, on the multilayer wiring board in which the voltage conversion IC 15 is built in, the first capacitor 16 which is positioned in an input side in relation to the voltage conversion IC 15 and a second capacitor 17 and an inductor 18 which are positioned in an output side are configured such that an electrode portion 172 of a ground potential in the second capacitor is disposed between an input section (electrode portion 162) provided in the first capacitor 16 and the inductor 18 having an output section (electrode portion 181) in relation to the input section.

Accordingly, a high frequency electric current based on a magnetic field generated in the inductor 18 comes to flow to the electrode portion 172 of the ground potential, whereby the overlapping of the high frequency electric current on an input voltage in the input section as a noise can be suppressed sufficiently, so that the fundamental operation and effect that a stable output voltage can be obtained from the output section (electrode portion 181) provided in the inductor 18 is achieved.

Further, since the voltage conversion IC 15 is built in the multilayer wiring board constituting the voltage conversion module 10, the multilayer wiring board, that is, the voltage conversion module 10 can be downsized.

Third Embodiment

Figure 4:
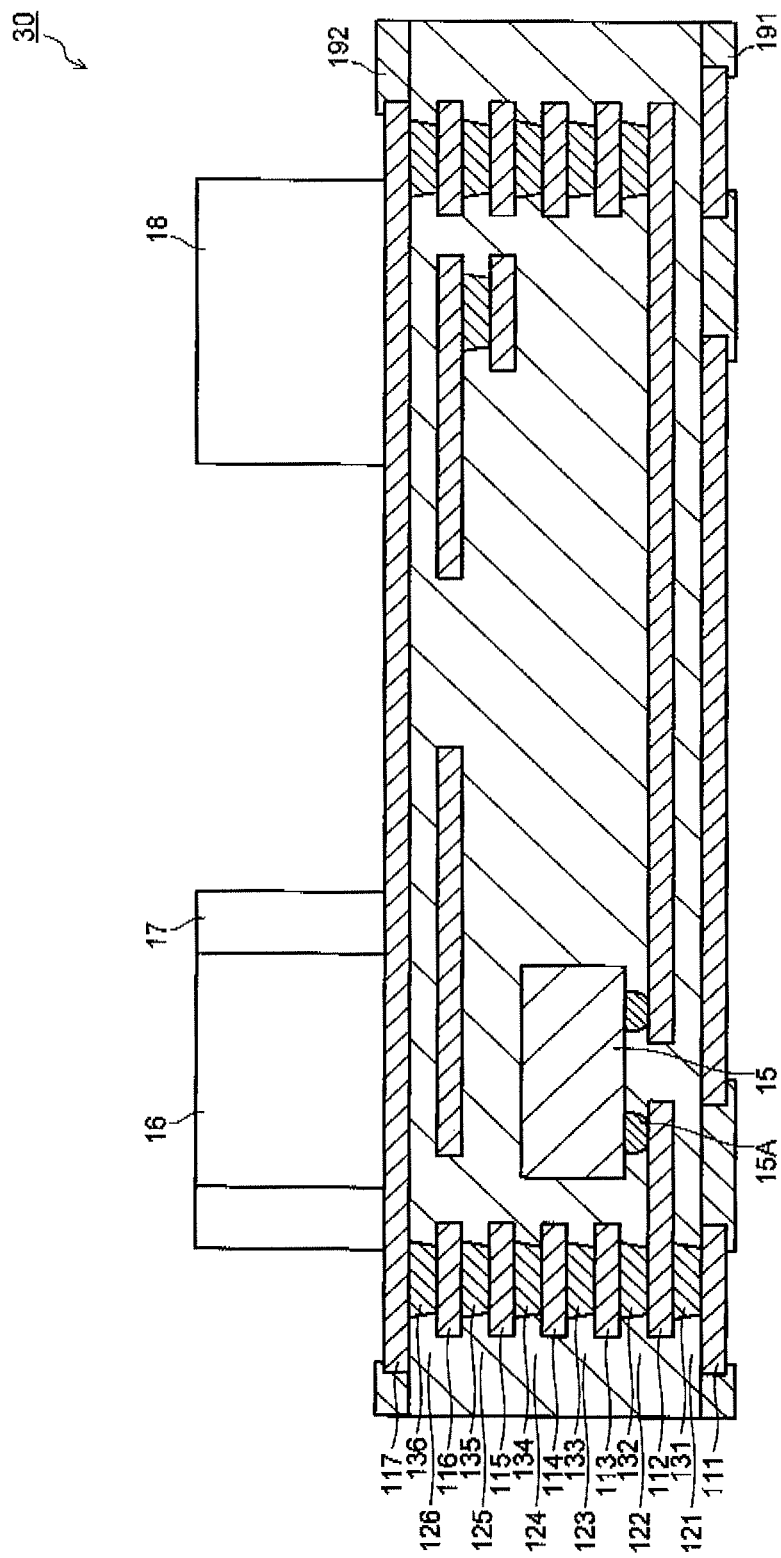
FIG. 4 is a partial cross-sectional configuration diagram illustrating a voltage conversion module of a third embodiment.
Figure 5:
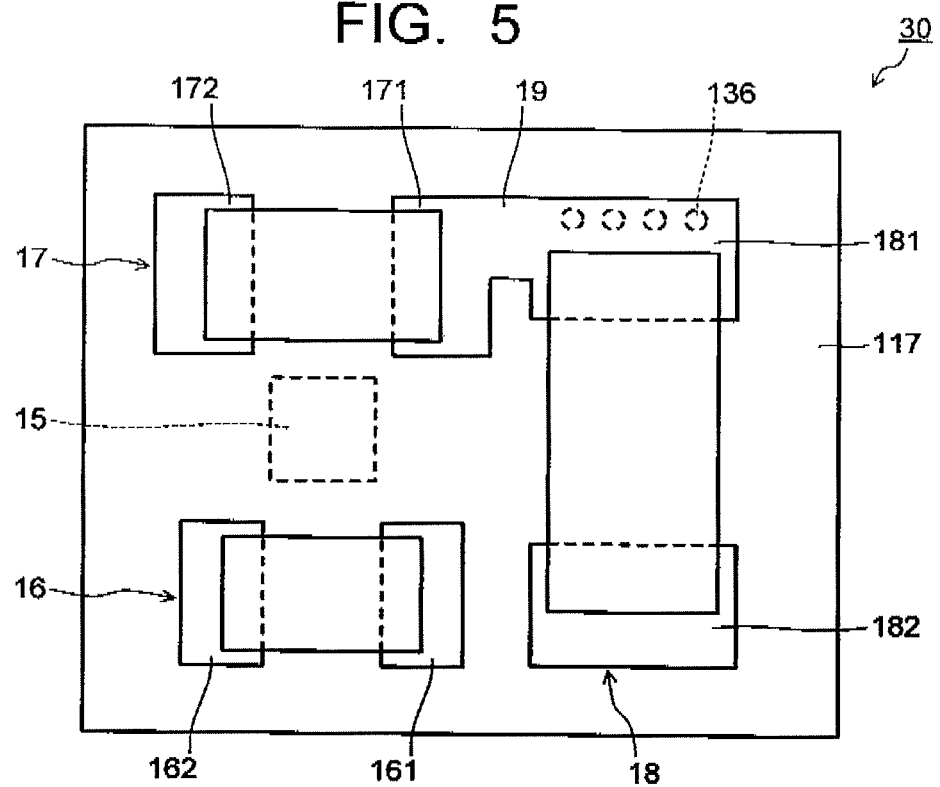
FIG. 5 is a top plan view of the voltage conversion module illustrated in FIG. 4.

FIG. 4 is a partial cross-sectional configuration diagram illustrating an example of a voltage conversion module of the present embodiment, while FIG. 5 is a top plan view of the voltage conversion module illustrated in FIG. 4. As is obvious from FIG. 4 and FIG. 5, only a portion of a multilayer wiring board of the voltage conversion module is illustrated in a cross section in FIG. 4. It should be noted that a component the same as or similar to the component illustrated in FIG. 1 and FIG. 2 related to the first embodiment is represented by using the same reference numeral.

A voltage conversion module 30 illustrated in FIG. 4 has, similarly to the voltage conversion module 10 illustrated in FIG. 1, in sequence from a lower side, a first wiring pattern 111, a second wiring pattern 112, a third wiring pattern 113, a fourth wiring pattern 114, a fifth wiring pattern 115, a sixth wiring pattern 116, and a seventh wiring pattern 117. Further, between the adjacent wiring patterns from the first wiring pattern 111 and the seventh wiring pattern 117, there are interposed a first insulating member 121 to a sixth insulating member 126, respectively.

The adjacent wiring patters among the first wiring pattern 111 to the seventh wiring pattern 117 are electrically connected to one another by a first interlayer connection body 131 to a sixth interlayer connection body 136. Thus, the first wiring pattern 111 to the seventh wiring pattern 117, the first insulating member 121 to the sixth insulating member 126, and the first interlayer connection body 131 to the sixth interlayer connection body 136 constitute a multilayer wiring board.

It should be noted that a resist layer 191 is formed on the first wiring pattern 111 in a manner to expose the wiring pattern 111, while a resist layer 192 is formed on the seventh wiring pattern 117 in a mariner to expose the wiring pattern 117.

Further, similarly to in the voltage conversion module 10 illustrated in FIG. 1, the second wiring pattern 112 functions as a component mounting wiring layer, and a voltage conversion IC 15 is electrically and mechanically connected to and mounted on the wring pattern 112 via a solder ball 15A.

It should be noted that though in the present embodiment the voltage conversion IC 15 is mounted on the second wiring patter 112, the voltage conversion IC 15 can be mounted on any one of the first wiring pattern 111 to the seventh wiring pattern 117. Further, the voltage conversion IC 15 can be vertically reversed and mount on a predetermined wiring pattern.

Further, the seventh wiring pattern 117 also functions as a component mounting layer, and a first capacitor 16, a second capacitor 17, and an inductor 18 are mounted in a manner to be adjacent to one another on the seventh wiring pattern 117, that is, on a main surface of the above-described multilayer wiring board. On this occasion, a length direction defined between electrode portions 161, 162 positioned on both ends of the first capacitor 16 and a length direction defined between electrode portions 171, 172 positioned on both ends of the second capacitor 17 are disposed in parallel in a manner to be parallel to each other and are disposed in a manner to be vertical to a length direction defined between electrode portions 181, 182 positioned on both ends of the inductor 18.

The first capacitor 16 is positioned, in the voltage conversion module 30 of the present embodiment, in an input side in relation to the voltage conversion IC 15. The second capacitor 17 and the inductor 18 are positioned in an output side in relation to the voltage conversion IC 15.

The electrode portion 162 of the first capacitor 16 constitutes an input section in the voltage conversion module 30 illustrated in FIG. 5, and an electric potential of the electrode portion 161 is set to ground. Further, the electrode portion 172 of the second capacitor 17 which faces the electrode portion 162 constituting the input section of the first capacitor 16 is set to ground. Further, the electrode portion 181 of the inductor 18 constitutes an output section in the voltage conversion module 30.

It should be noted that the electrode portion 171 of the second capacitor 17 and the electrode portion 181 constituting the output section of the inductor 18 are electrically connected by a wiring pattern 19 made of an electric good conductor such as Au, Ag, and Cu, for example.

Further, the first capacitor 16 and the inductor 18 are electrically connected to the seventh wiring pattern 117 via a not-shown solder material or the like.

Further, the voltage conversion IC 15 is electrically connected, via the second wiring pattern 112 and the first interlayer connection body 131 to the sixth interlayer connection body 136, to the remaining wiring patterns, that is, the first wiring pattern 111 and the third wiring pattern 113 to the seventh wiring pattern 117. Further, the first capacitor 16 and the inductor 18 are electrically connected, via the seventh wiring pattern 117 and the first interlayer connection body 131 to the sixth interlayer connection body 136, to the remaining wiring patterns, that is, the first wiring pattern 111 to the sixth wiring pattern 116.

Accordingly, the voltage conversion IC 15 is electrically connected also to the first capacitor 16 and the inductor 18, and the voltage conversion module 30 illustrated in FIG. 5 functions as a voltage conversion element.

In the voltage conversion module 30, since a large electric current flows in the inductor 18, a large magnetic field is generated from the inductor 18. Accordingly, in the voltage conversion module 30, if the input section constituted by the electrode portion 162 of the first capacitor 16 is disposed close to the inductor 18, a high frequency electric current based on the above-described magnetic field is overlapped on an input voltage inputted to the voltage conversion module 30, and consequently, an output voltage from the output section constituted by the electrode portion 181 of the inductor 18 is not stabilized.

However, according to the voltage conversion module 30 of the present embodiment, on the multilayer wiring board housing the voltage conversion IC 15, the first capacitor 16 which is positioned in the input side in relation to the voltage conversion IC 15 and the second capacitor 17 and the inductor 18 which are positioned in the output side are configured such that the electrode portion 161 of a ground potential in the first capacitor 16 is disposed between the input section (electrode portion 162) provided in the first capacitor 16 and the inductor 18 having the output section (electrode portion 181) in relation to the input section.

In other words, it is configured such that the electrode portion 161 of the constant ground potential is disposed between the input section and the inductor 18 of the voltage conversion module 30. Accordingly, since the high frequency electric current based on the magnetic field generated in the inductor 18 flows to the electrode portion 161 of the ground potential, it becomes possible to sufficiently suppress overlapping of the high frequency electric current based on the magnetic field on the input voltage in the input portion as a noise. As a result, it becomes possible to obtain a stable output voltage from the output section (electrode portion 181) provided in the inductor 18.

It should be noted that, though in the present embodiment the second capacitor 17 and the inductor 18 are electrically connected by the wiring layer 19, the second capacitor 17 and the inductor 18 can be connected via the wiring pattern and the interlayer connection body which are formed in the multilayer wiring board.

It should be noted that other features and configurations are similar to those of the first embodiment, and explanation thereof will be omitted.

Hereinabove, the present invention is explained in detail based on the above-described concrete examples, but the present invention is not limited to the above-described concrete examples, and any modification and alteration are possible without departing from the scope of the invention.

What is claimed is:

1. A voltage conversion module, comprising:

multilayer wiring board which has a plurality of wiring patterns stacked in sequence separately from one another, insulating members each positioned between the plurality of wiring patterns, and interlayer connection bodies electrically connecting the plurality of wiring patterns;

a voltage conversion IC to perform voltage conversion, the voltage conversion IC mounted to one of the wiring patterns positioned in an inner side among the plurality of wiring patterns;

a first capacitor in an input side and a second capacitor in an output side, the first capacitor and the second capacitor being mounted on a main surface of the multilayer wiring board and having electrode portions on both ends electrically connected to the voltage conversion IC via the plurality of the wiring patterns and the interlayer connection bodies; and an output side inductor which has electrode portions on both ends electrically connected to the second capacitor in series on the main surface of the multilayer wiring board, wherein one of the electrode portions in the first capacitor constitutes an input section and one of the electrode portions of the inductor constitutes an output section; and wherein the other of the electrode portions in the first capacitor or one of the electrode portions in the second capacitor is positioned between the input section and the inductor, and the other of the electrode portions in the first capacitor or the one of the electrode portions in the second capacitor is electrically set to ground.

2. The voltage conversion module according to claim 1, wherein the first capacitor, the second capacitor, and the inductor are disposed in parallel to be parallel to one another in length directions defined between the electrode portions positioned on respective both ends on the multilayer wiring board, the one of the electrode portions in the second capacitor is positioned between the input section and the inductor, and the one of the electrode portions is electrically set to ground.

3. The voltage conversion module according to claim 2, wherein the one of the electrode portions constituting the input section of the first capacitor faces the one of the electrode portions electrically set to ground of the second capacitor.

4. The voltage conversion module according to claim 1, wherein the first capacitor and the second capacitor are disposed in parallel to be parallel to each other in length directions defined between the electrode portions positioned on respective both ends on the multilayer wiring board and is disposed to be vertical to a length direction defined between the electrode portions positioned on both ends of the inductor; and wherein the other of the electrode portions in the first capacitor is positioned between the input section and the inductor, and the other of the electrode portions is electrically set to ground.

5. The voltage conversion module according to claim 1, wherein the voltage conversion IC is positioned directly below the first capacitor.

6. The voltage conversion module according to claim 1, wherein a capacitance of the first capacitor is equal to or more than 2 $\mu$F and the first capacitor functions as a capacitor for input voltage stabilization of the voltage conversion IC.

7. The voltage conversion module according to claim 1, wherein a capacitance of the second capacitance is equal to or more than 4 $\mu$F and the second capacitor functions as a capacitor for output voltage stabilization of the voltage conversion IC.

* * * * *